(12) United States Patent  (10) Patent No.: US 8,823,372 B2
Weber et al.  (45) Date of Patent: Sep. 2, 2014

(54) METHOD FOR HOMOGENIZING RESOLUTION IN MAGNET RESONANCE TOMOGRAPHY MEASUREMENTS USING NON-LINEAR ENCODING FIELDS

(75) Inventors: Hans Weber, Freiburg (DE); Maxim Zaitsev, Freiburg (DE); Daniel Gallichan, Freiburg (DE); Gerrit Schultz, Karlsruhe (DE)

(73) Assignee: Universitaetsklinikum Freiburg, Freiburg (DE)

( * ) Notice: Subject to any disclaimer, the term of this patent is extended or adjusted under 35 U.S.C. 154(b) by 520 days.

(21) Appl. No.: 13/064,277

(22) Filed: Mar. 16, 2011

(65) Prior Publication Data

US 2011/0241678 A1  Oct. 6, 2011

(30) Foreign Application Priority Data

Mar. 31, 2010  (DE) .......................... 10 2010 003 552

(51) Int. Cl.
 *G01R 33/48* (2006.01)
 *G01R 33/483* (2006.01)
(52) U.S. Cl.
 CPC ................................. *G01R 33/4833* (2013.01)
 USPC .......................................... 324/309; 324/307
(58) Field of Classification Search
 CPC ....................... G01R 33/4833; G01R 33/4824
 USPC ............ 324/307, 309; 600/410; 382/131, 132
 See application file for complete search history.

(56) References Cited

U.S. PATENT DOCUMENTS 5,122,748 A  6/1992 Oh
6,326,786 B1 * 12/2001 Pruessmann et al. ......... 324/312
6,486,671 B1 * 11/2002 King ............................. 324/307
6,841,998 B1  1/2005 Griswold
6,914,429 B2 * 7/2005 Ookawa ........................ 324/309
7,411,395 B2  8/2008 Hennig
7,906,968 B2  3/2011 Hennig
2003/0206016 A1 * 11/2003 Madore ........................ 324/309
2004/0160221 A1  8/2004 Kiefer
2007/0182411 A1 * 8/2007 Bammer et al. .............. 324/307
2008/0197842 A1 * 8/2008 Lustig et al. .................. 324/307
2008/0224697 A1 * 9/2008 Saranathan et al. .......... 324/307
2009/0128148 A1  5/2009 Hennig

OTHER PUBLICATIONS

Weber, Hans et al. "A time-efficient sub-sampling strategy to homogenise resolution in PatLoc imaging"; May 1, 2010; PISMRM 18; p. 548.*

(Continued)

*Primary Examiner* — Melissa Koval
*Assistant Examiner* — Rishi Patel
(74) *Attorney, Agent, or Firm* — Paul Vincent

(57) ABSTRACT

A method for magnetic resonance (=MR) imaging, wherein non-linear gradient fields are applied for the purpose of spatial encoding to acquire images of an object to be imaged and wherein the magnet resonance signal radiated from the object to be imaged is sampled on grids in time, to thereby obtain sampling points, is characterized in that the object to be imaged is mapped completely in regions of stronger gradient fields by increasing the density of the sampling points in the center of k-space, and additional sampling points are specifically acquired in the outer regions of k-space according to a k-space sampling pattern depending on the desired distribution of the resolution in the measurement, wherein the MR measurement is calculated with the additional sampling points. An MR imaging method is thereby provided by means of which homogenized resolution is achieved in the MR measurements using non-linear gradient fields for spatial encoding.

14 Claims, 9 Drawing Sheets

(56) References Cited

OTHER PUBLICATIONS

Chi-Ming Tsai, at al. "Reduced Aliasing Artifacts Using Variable-Density k-Space Sampling Trajectories", Magnetic Resonance in Medicine 43:452-458 (2000).

Jason P. Stockmann, Pelin Aksit Ciris, Gigi Galiana, Leo Tam and R: Todd Constable, "O-Space Imaging: Highly Efficient Parallel Imaging Using Second-Order Nonlinear Fields as Encoding Gradients With No Phase Encoding", Magnetic Resonance in Medicine 000:000-000 (2010).

Juergen Hennig, Anna Masako Welz, Gerrit Schultz, Jan Korvink, Zhenyu Liu, Oliver Speck, Maxim Zaitsev, "Parallel imaging in non-bijective, curvilinear magnetic field gradients: a concept study", Magn Reson Mater Phy (2008) 21:5-14.

J.L. Duerk "Principles of MR image formation and reconstruction", Magn Reson Imaging Clin N Am, vol. 7, pp. 629-659, Nov. 1999.

D.J. Larkman and R.G. Nunes, "Parallel magnetic resonance imaging", Phys Med Biol, vol. 52, pp. R15-R55, Apr. 2007.

K.P. Pruessmann, M. Weiger, M.G. Scheidegger and P. Boesiger, "Sense: sensitivity encoding for fast MRI", Magn Reson Med, vol. 42, pp. 952-962, Nov. 1999.

M.A. Griswold, P.M. Jakob, R.M. Heidemann, M. Nittka, V. Jellus, J. Wang, B. Kiefer and A. Haase, "Generalized autocalibrating partially parallel acquisitions (GRAPPA)", Magn Reson Med, vol. 47, pp. 1202-1210, Jun. 2002.

J. Hennig, A.M. Welz, G. Schultz, J. Korvink, Z. Liu, O. Speck and M. Zaitsev, "Parallel imaging in non-bijective, curvilinear magnetic field gradients: a concept study", MAGMA, vol. 21, pp. 5-14, Mar. 2008.

M.A. Bernstein, K.F. King and X.J. Zhou, Handbook of MRI Pulse Sequences: Elsevier, 2004, pp. 378-383.

T. Grotz, B. Zahneisen, A. Ella, M. Zaitsev and J. Hennig, "Fast functional brain imaging using constrained reconstruction based on regularization using arbitrary projecions", Magn Reson Mad, vol. 62, pp. 394-405, Aug. 2009.

\* cited by examiner

METHOD FOR HOMOGENIZING RESOLUTION IN MAGNET RESONANCE TOMOGRAPHY MEASUREMENTS USING NON-LINEAR ENCODING FIELDS

This application claims Paris convention priority of DE 10 2010 003 552.1 filed Mar. 31, 2010, the entire disclosure of which is hereby incorporated by reference.

BACKGROUND OF THE INVENTION

The invention concerns a method for magnetic resonance (=MR) imaging, wherein non-linear gradient fields are applied for the purpose of spatial encoding to acquire images of an object to be imaged and wherein the magnetic resonance signal radiated from the object to be imaged is sampled on grids in time, thereby obtaining sampling points.

Such a method is known, for example, from DE 10 2007 054 744 B4 and DE 10 2005 051 021 A1.

Nuclear magnetic resonance (=NMR) tomography, also referred to as magnetic resonance imaging (=MRI), MR imaging or magnetic resonance tomography (=MRT), is a non-invasive method that enables the internal structure of objects to be spatially resolved and displayed in three dimensions. It is based on the energy behavior of atomic nuclei in a magnetic field, which permits excitation of their nuclear spins by means of suitable radio-frequency pulses followed by analysis of the response. MRT imaging is primarily used in medicine to obtain a view into the interior of the human body.

The signal of the atomic nuclei of the object under examination that is emitted in response to excitation by radio-frequency pulses is read out using suitable receiver coils. The spatial encoding required to allocate the measurement signal to a position within the object to be imaged is performed using additional spatially variable magnetic fields $B_z(x,y,z)$ that are superposed on the static main magnetic field $B_0$, causing atomic nuclei to exhibit different Larmor frequencies at different positions. The magnetic fields conventionally used for this purpose exhibit the most linear possible variation of the strength along the relevant spatial direction and are termed constant or linear magnetic field gradients. Commonly used gradient systems generate three orthogonal gradients in the x-, y-, and z-directions, but local gradient systems are also used in spatial encoding. 1-, 2-, or 3-dimensional spatial encoding is performed by varying the magnetic field gradients in all three spatial directions according to the known principles, for example, Fourier encoding, filtered back-projection, or another known method [1]. The MR signals S that are measured based on this variation in the presence of gradients with different strengths are stored in k-space, the position in k-space being a result of the strength and duration of the switched gradient fields. Which k-space points are sampled during a measurement and in which sequence is described by the trajectory of the measurement method. Generally, the signal components that contain low-frequency information and therefore describe the rough structure of the object to be imaged are stored toward the center of k-space. The edge regions, on the other hand, contain detailed, higher-frequency information.

Generally, the signal intensity in k-space $S(k_x, k_y, k_z)$ can be described by applying the encoding matrix E to the signal density of the object to be imaged in real space $I_r(x,y,z)$:

$$S = E I_r \quad (1)$$

In this way, it is possible to calculate the signal density by inverting the encoding matrix and applying it to the acquired k-space data and therefore to calculate the image to be reconstructed (=MR measurement) directly. In the usual case of an equidistantly sampled k-space, this reconstruction process is simpler: the signal density in frequency space ($I_\omega(\omega_x, \omega_y, \omega_z)$) results directly from the inverse Fourier transform (iFT) of the k-space signal $S(k_x, k_y, k_z)$:

$$I_\omega = \mathrm{iFT}(S) \quad (2)$$

This can be transformed into the signal density in real space $I_r(x,y,z)$ in accordance with the progression of the magnetic field gradient. In spatial encoding with conventional linear gradients, there is a linear relationship between frequency space and real space. The resolution in the reconstructed image is therefore spatially homogenous. Because k-space is sampled discretely, the reconstructed image is a superposition of an infinite number of repetitions of the object to be imaged. According to $$FOV = \frac{1}{\Delta k} \quad (3)$$

the distance between the repetitions in the image space is determined by the distance $\Delta k$ between the points in k-space. According to equation (3), the distance FOV (=field of view) is the reciprocal of the distance between the k-space points. Increasing the distance $\Delta k$ when sampling the k-space therefore reduces the FOV. If the FOV is too small and does not cover the object to the imaged completely, the repetitions are superposed. The outer regions of the object to be imaged therefore appear folded inward in the reconstructed MR measurement. These folded image components are termed aliasing. If N k-space points with distance $\Delta k$ are acquired, this corresponds to a maximum k-space coverage of $N \times \Delta k$. According to the Nyquist theorem $$N \times \Delta k = \frac{N}{FOV} = \frac{1}{\Delta x} \quad (4)$$

this yields the image resolution $\Delta x$. The number of image elements within the FOV, which are also termed voxels, therefore corresponds to the number of k-space points acquired.

For one-dimensional measurement, one row in k-space is acquired. The gradient switched during the measurement is termed the read gradient. The resolution of the MR measurements is determined by the strength and duration of the read gradient: the steeper the gradient and the longer the time for which it is switched, the further from the center of k-space are the points which can be acquired. For two-dimensional MR measurements, multiple k-space rows are acquired, wherein the number of rows corresponds to the number of points in the second dimension of the image. The gradient responsible for phase encoding is switched for a certain time interval between excitation and measurement of the signal and its strength is varied accordingly for each row. The measurement duration therefore results from the product of the number of rows and the duration TR (=time of repetition) for measurement of one row. In three-dimensional MR measurements, k-space is extended by a third dimension. For encoding, an additional phase gradient is switched in the relevant direction. The number of k-space points along each dimension and therefore also the number of resulting image elements are described by the matrix size. For a matrix size of $N_x \times N_y \times N_z$ and a row measurement duration TR in 3D measurement, a measurement time TA (=time of acquisition) of $$TA(3D) = N_y \times N_z \times TR, \quad (5)$$

therefore results, and in 2D measurement with a $N_x \times N_y$ matrix, the corresponding measurement time is $$TA(2D) = N_y \times TR. \quad (6)$$

To reduce the measurement time, modern multi-dimensional MR methods require strong gradients of short duration, as well as fast gradient switching.

A further way of reducing the measurement duration is to use multiple receiver coils and the positional information they provide [2]. In the parallel imaging technique SENSE [3], known from U.S. Pat. No. 6,326,786 B1, specific k-space rows are omitted during measurement. The measurement duration is shortened: this is called acceleration. The images reconstructed from the acquired data of the individual coils are therefore aliased. Because the sensitivities of the receiver coils with which each received signal is modulated exhibit different variations in space, different weighting results between the intensity of the image and the intensity of the aliasing in each coil image. If the sensitivity distributions of the individual coils are known, the aliasing can be described by solving a corresponding system of equations and calculated accordingly from the overall image resulting from all coil data. A further parallel imaging technique is known as GRAPPA [4] (see DE 101 26 078 B4). Unlike SENSE, in this case, the missing k-space rows are calculated from the additional coil information before reconstruction of the MR measurement.

As technical development progressed during the history of MR imaging, it became possible to build ever stronger gradients and therefore achieve higher image resolution. For the simple technical reason that cables and coil wires cannot be strengthened any further due to space considerations, ever stronger gradient systems cannot provide a viable solution for the future. Moreover, linear gradient systems already in common use especially for larger objects to be imaged and typical spatial resolutions and measurement times result in considerable magnetic field differences in the edge regions. These interact with the main magnetic field $B_0$. The resulting rapidly varying Lorentz forces produce large mechanical stresses in the tomograph, accompanied by considerably disturbing acoustical noise. These fast and strong field variations can additionally cause neural stimulations in patients. The technical limit has therefore also reached the physiological limit of human beings. A further increase in resolution, or a reduction in the measurement time, therefore requires alternative approaches. Such an approach for this purpose is given by systems that use adapted, non-linear gradients for spatial encoding, such as PatLoc [5] (known from DE 10 2007 054 744 B4 and DE 10 2005 051 021 A1). In a typical implementation, quadrupolar fields are used, for example, for encoding in the x and y direction, while, for technical reasons, encoding in the direction of the $B_0$ field is still performed with a linear gradient. These non-linear gradient systems are characterized by smaller magnetic field differences in the region to be imaged, permitting faster gradient switching times. An associated non-linear mapping equation is used for the transformation between frequency space and real space.

However, this prior art has the drawback that using non-linear gradient fields for spatial encoding results in spatially non-homogenous resolution in the resulting images. In medical diagnosis, in particular, this makes interpretation of the MR measurements considerably more difficult. Regions with a flat gradient profile are only represented by a few, correspondingly large voxels. Extremely flat positions result in a single voxel and therefore appear as "holes" in the images. It is therefore not possible to represent the object to be imaged at those locations. It has so far only been possible to increase the resolution in the lower-resolution regions and reduce the "hole diameter" step by step by the time-consuming standard method of globally increasing the resolution of the entire MR measurement.

In the standard method of globally increasing the resolution, parts of the additional measurement time are necessarily used only to further increase the resolution even in the regions that already have a steeper gradient profile and therefore sufficient resolution. Such time-consuming resolution of the object over and above the requirements is not helpful, especially with a view towards reducing the measurement time. If, in the regions of high gradient strength, the physical resolution limit of an MR measurement due to molecular diffusion is also reached, no additional information can in any event be obtained. But in lower-resolution regions as well, the additional information is already limited because smaller voxels exhibit a smaller signal-to-noise ratio(=SNR). Image quality is thus worsened by increasing the resolution beyond the requirements.

The object of the invention is therefore to provide an MR imaging method by which greater homogenized resolution is achieved in the MR measurement using non-linear gradient fields for spatial encoding.

SUMMARY OF THE INVENTION

According to the invention, this object is achieved in a surprisingly simple but effective manner in that the object to be imaged is mapped completely in regions of stronger gradient fields by increasing the density of the sampling points in the center of k-space, wherein additional sampling points are specifically acquired in the outer regions of k-space according to a k-space sampling pattern depending on the desired distribution of the resolution in the measurement, and the MR measurement is calculated with the additional sampling points.

The invention is based on the principle that the resolution is adapted to the resolution level of the regions that already have sufficient resolution by a specific local increase in resolution in the regions that have lower resolution due to weaker gradients.

The advantages obtained with the invention are, in particular, that the total resolution within the MR measurement is homogenized by specifically adapting the resolution in the regions of poorer resolution to the resolution level in the regions that already have higher, sufficient resolution. In this way, it is possible to represent all structures of the object to be imaged within the mapped region with comparable precision. In the regions with very low gradients, such as the region of the passage through zero in the case of a quadrupolar field, the size of the voxel in which no representation is performed is reduced by the local increase in resolution. This makes interpretation of the MR measurements considerably easier. Homogenous resolution also corresponds to the level of conventional MR measurements, in the interpretation of which, users are already practiced.

In the inventive method, the center of k-space is sampled with a higher density such that the object to be imaged is sufficiently mapped in the regions of stronger gradient fields, and additional points are specifically acquired in the outer regions of k-space to increase the information content of the MR measurements with the associated higher-frequency information in the regions of lower resolution. This is possible because use of non-linear gradients for spatial encoding results in a correlation between the real space position and the k-space position. The measurement of k-space signals with lower frequency by sampling the k-space center with a higher density is thereby sufficient to be able to represent the object to be imaged with adequate resolution in the regions with a steeper gradient profile. The spacing of the acquired points in k-space determines the size of the field of view in this case, too, and is chosen small enough to cover the entire object. By analogy with equation (4), an increase in the image resolution requires additional acquisition of higher-frequency k-space points. If the spacing of the additional k-space points is accordingly increased, these points only contribute toward increasing the resolution in a correspondingly smaller field of view. This process is comparable with a reduction of the field of view by increasing the k-space step size. By specific selection of the position of the additional k-space points and corresponding orientation of the associated field of view, the associated increase in resolution can be limited to the regions with a weaker gradient profile and correspondingly poorer resolution. In this case, too, reducing the field of view in the case of non-coverage of the object to be imaged results in aliasing artifacts. Because of the correlation between k-space and real space, the image components now folded inwardly are already known with sufficient precision from the lower-frequency k-space data, permitting elimination of the relevant artifacts in the regions with increased resolution. In this way, the measurement time can be reduced as compared with the standard method for globally increasing the resolution because only those k-space points are acquired that really contribute to the increase in resolution in the regions of lower resolution.

In one variant of the inventive method, the k-space sampling pattern is composed of sub-patterns, wherein each sub-pattern comprises the same number of sampling points, wherein for each sub-pattern the step size between the sampling points is increased by a flexible factor according to the requirements for the homogeneity of the resolution of the MR measurement and the signal-to-noise ratio(=SNR) distribution in the measurement. The k-space data of each sub-pattern i correspond to a field of view $FOV_i$ with a resolution resulting from the relevant k-space sampling step size. On the other hand, the size of the field of view of the sub-pattern with maximum step size ($\Delta k_1$) determines the size of the total field of view. In this way, the resolution in the regions that previously had lower resolution is increased step by step by successive inclusion of further k-space points according to the sub-patterns. Targeted selection of the size of the sub-regions $FOV_i$, in which the resolution is increased by a constant factor compared with the resolution in the neighboring sub-region, is possible by means of the spacing factor α, which determines the increase in the step size. The distance between the sub-regions can therefore be individually adapted. A time saving is achieved during data acquisition over the standard method of globally increasing the resolution because of the reduction in the total number of data points to be acquired.

Another preferred embodiment is characterized by the fact that the k-space sampling pattern is composed of sub-patterns, wherein for each sub-pattern, the step size between the sampling points is doubled and the number of sampling points per sub-pattern is varied in accordance with the requirements for the homogeneity of the resolution of the MR measurement and the signal-to-noise ratio(=SNR) distribution in the measurement. In this way, the resolution in the regions that previously had lower resolution can be increased step by step by successive inclusion of further k-space points according to the sub-patterns. By means of the number of k-space points acquired per sub-pattern, the increase in resolution within a sub-region as compared with the neighboring sub-regions can be individually adapted. This permits, in particular, adaptation of the step in the resolution at the transitions between two sub-regions.

An embodiment also falls within the scope of the present invention that is characterized in that the k-space sampling pattern is composed of sub-patterns, wherein for each sub-pattern the step size between the sampling points is modified by a flexible factor according to the requirements for homogeneity of the resolution of the MR measurement and of the signal-to-noise ratio(=SNR) distribution in the measurement, and the number of sampling points per sub-pattern is varied according to the requirements for homogeneity of the resolution of the MR measurement and of the signal-to-noise ratio(=SNR) distribution in the measurement, wherein, for a particular gradient field geometry, the step size of the sub-pattern with the smallest point spacing determines the size of the total field of view, and wherein, for a particular gradient field geometry, the step size and the number of sampling points of the sub-pattern with the largest point spacing determine the size of the largest voxel. In this way, approximation to a k-space sampling pattern with an especially smoothly and monotonically declining sampling density can be achieved. This embodiment permits generation of numerous k-space sampling patterns made up of Cartesian sub-patterns. This embodiment also permits the size of the sub-regions and the degree of the increase in resolution within them to be adapted to the existing geometry of the gradient field and of the object to be imaged over the progression of the sampling density.

In another preferred embodiment, the k-space sampling pattern corresponds to radial sampling of k-space, wherein the sampling density decreases smoothly and monotonically with the distance from the k-space center, the absolute sampling density being scaled globally by means of the number of k-space radii sampled, and, for a particular gradient field geometry, the size of the largest voxel is determined by the length of the k-space radii and by the maximum spacing of the k-space radii at the edge of the sampled k-space. The associated subsampling is performed herein automatically in both dimensions of k-space. Because the sampling density increases toward the center of k-space, interpolation of the data onto Cartesian sub-patterns is also possible in accordance with the minimal density in the original pattern.

Alternatively, in another embodiment, the k-space sampling pattern corresponds to spiral sampling of the k-space, wherein the spiral comprises one or more elements, the absolute sampling density being varied globally by means of the number of spiral elements and locally by varying the spiral radius pitch, for a particular gradient field geometry, the maximum radial point spacing in the region of the center of k-space determines the size of the total field of vision, and, for a particular gradient field geometry, the maximum distance of the sampling points from the center of k-space and the maximum radial point spacing in the edge region of the sampled k-space determine the size of the largest voxel. Spiral sampling is therefore an especially flexible k-space sampling scheme. Unlike radial sampling, it is also possible specifically to vary the sampling density in the center of k-space and the decrease in the k-space sampling density by means of the number of spiral elements and by varying the spiral radius increments. In the case of sufficiently slow signal decay, it is also possible to sample k-space completely by means of a few or merely one excitation upon application of the reading gradient along the spiral. The subsampling is also performed automatically in the two dimensions of k-space.

In another advantageous embodiment, data acquisition is performed with an array comprising multiple receiver coils, wherein the spatial information that is contained in the differing sensitivity distribution of the receiver coils is used to increase subsampling of k-space. The receiver coils are disposed around the object to be imaged. The resulting additional spatial encoding of the acquired signals can now also be used for elimination of the aliasing artifacts during the homogenization process. Use of multiple receiver coils enables a reduction in the number of k-space data items to be acquired or a further increase in the spacing factors $\alpha_i$. This significantly speeds up data acquisition.

In a further development of this embodiment, reconstruction of the signal density of the object to be represented is performed by inversion of the encoding matrix from the acquired data. The known methods of matrix inversion are used to do this. The resulting resolution can be strongly influenced by the type of inversion process. Direct reconstruction of k-space data is therefore possible without any special requirements of the sampling scheme, provided enough computer power is available. The MR measurements can therefore be calculated from the k-space data that were acquired with any sampling patterns. Since interpolation of k-space points onto an equidistant grid, or the like, is thereby not necessary, the associated distortion of k-space data is eliminated. This is especially advantageous in the case of tailor-made sampling patterns in which the necessary k-space points are acquired specifically and efficiently and direct application of standardized Fourier methods in the reconstruction is not possible.

Alternatively, in another embodiment, the signal density of the object to be represented is approximated iteratively by the method of conjugate gradients over the product of the inverse encoding matrix and the signal intensity in k-space. This embodiment therefore permits direct reconstruction of the k-space data without special requirements of the sampling scheme. This requires significantly less computer power and computation time than the matrix inversion method, especially with larger data sets.

A further preferred embodiment is characterized in that the k-space points are separately reconstructed according to the relevant sub-patterns with fast, standardized Fourier methods and the image with homogenized resolution is iteratively calculated from the individual images of the sub-patterns. This method is hereinafter referred to as the "iteration method." The single images with higher resolution from the k-space data of the relevant sub-patterns replace the corresponding regions in the single images with lower resolution. To be able to eliminate the aliasing components in the single images with higher resolution, the aliasing is simulated from the single images that have resolution which is one respective step lower. This is achieved with sufficient precision because of the non-homogenous resolution of the single images resulting from the use of non-linear gradients for spatial encoding. The reconstruction process is iterative, starting at the single image with the highest resolution, which exhibits the most multiple aliasing. This preferred embodiment permits the use of standardized Fourier methods such as FFT within the iterative reconstruction and therefore fast image calculation. Because the method is applied in frequency space, a single more time-consuming transformation to real space is only required at the end. The iteratively calculated complete image provides representation of the object to be imaged with especially homogenous resolution. Even after several iteration steps, the image regions that now have higher resolution are of high quality.

Alternatively, in another preferred embodiment, the image with homogenized resolution is composed of sub-images, wherein the sub-images are reconstructed from all acquired data points using standardized Fourier methods, these data points being distributed over an equidistant grid for this purpose and are weighted with the weighting factors specific to each sub-pattern. This method is hereinafter referred to as "weighting method." From each sub-pattern, an image is thus obtained with a size corresponding to the total field of view, wherein only that part of the object to be imaged which is located within a region corresponding to the field of view $FOV_i$ of the associated sub-pattern, is represented without aliasing. The total image is therefore composed in frequency space from these sub-images and then finally has to be transformed only once into real space. This preferred embodiment also permits use of standardized Fourier methods within the reconstruction and therefore fast calculation of the measurements. The image composed of the individual $FOV_i$ exhibits an especially homogenous SNR distribution so that transitions between the individual $FOV_i$ are barely visible.

In a further development of this embodiment, the MR measurement with homogenized resolution is calculated from the subsampled k-space signals of the different receiver coils using the different sensitivity distributions of the receiver coils, wherein only every R-th k-space point of the k-space sampling pattern is acquired, R being less than or equal to the number of receiver coils used, wherein the subsampling is used to reduce the measurement time and/or globally increase the resolution. Using the known SENSE or GRAPPA reconstruction technique, the aliasing resulting from the non-acquired k-space data points is back-calculated using the different coil sensitivity distributions (SENSE), or the missing k-space points are interpolated (GRAPPA). In this way, sampling points can be specifically omitted in the sub-patterns and the measurement duration therefore shortened. It is also possible to omit entire sub-patterns, resulting in a further shortening of the measurement time.

Further advantages of the invention can be derived from the description and the drawing. The characteristics stated above and below can also be used according to the invention, singly or in any combination. The embodiments shown and described are not an exhaustive list but are examples to explain the invention.

The invention is shown in the drawing and is explained in more detail using examples.

BRIEF DESCRIPTION OF THE DRAWING

FIG. 1 b) a radial k-space sampling pattern;

FIG. 1 c) a spiral k-space sampling pattern, comprising four spiral elements;

FIG. 1 d) a Cartesian k-space sampling pattern, comprising I=3 sub-patterns each with doubling of the sampling interval;

FIG. 6a a spiral k-space sampling pattern, comprising a spiral element with an exponentially increasing spiral radius pitch;

FIG. 6b a spiral k-space sampling pattern, comprising two spiral elements (E1 and E2), wherein both elements are rotated through 180° and otherwise are similar to the element shown in FIG. 6a;

FIG. 6c a spiral k-space sampling pattern, comprising an element and linearly increasing spiral radius pitch, wherein the pitch is increased in steps and the resulting zones, and the corresponding maximum k-space point spacings ($\Delta k_i$) are also drawn;

DESCRIPTION OF THE PREFERRED EMBODIMENT

The present invention relates to a further development of methods for magnetic resonance imaging that use non-linear gradients for spatial encoding. Such a method is known, for example, by the name PatLoc, by which the properties of non-linear spatial encoding are explained below by way of example.

In a typical implementation of PatLoc, spatial encoding is performed along the two dimensions perpendicularly with respect to the direction of the main magnetic field $B_0$ by means of quadrupolar gradient fields while, for technical reasons, a linear gradient is still used for encoding in the direction of the $B_0$ field. While commonly used linear gradient systems already result in considerable magnetic field differences for typical spatial resolutions and measurement times in the outer regions, especially, with large objects to be imaged, the latter can be considerably reduced through use of an adapted, non-linear gradient system. Consequentially, the Lorentz forces resulting from interaction with the main magnetic field $B_0$ when the gradients are switched are lower, which also reduces the mechanical load in the tomograph and therefore disturbing acoustical noise as well as the risk of neural stimulations in the patient resulting from the interactions. With such adapted, non-linear gradient systems, it is therefore possible to switch gradients faster, which, in turn, permits further development of modern and faster MR imaging methods.

Figure 2:
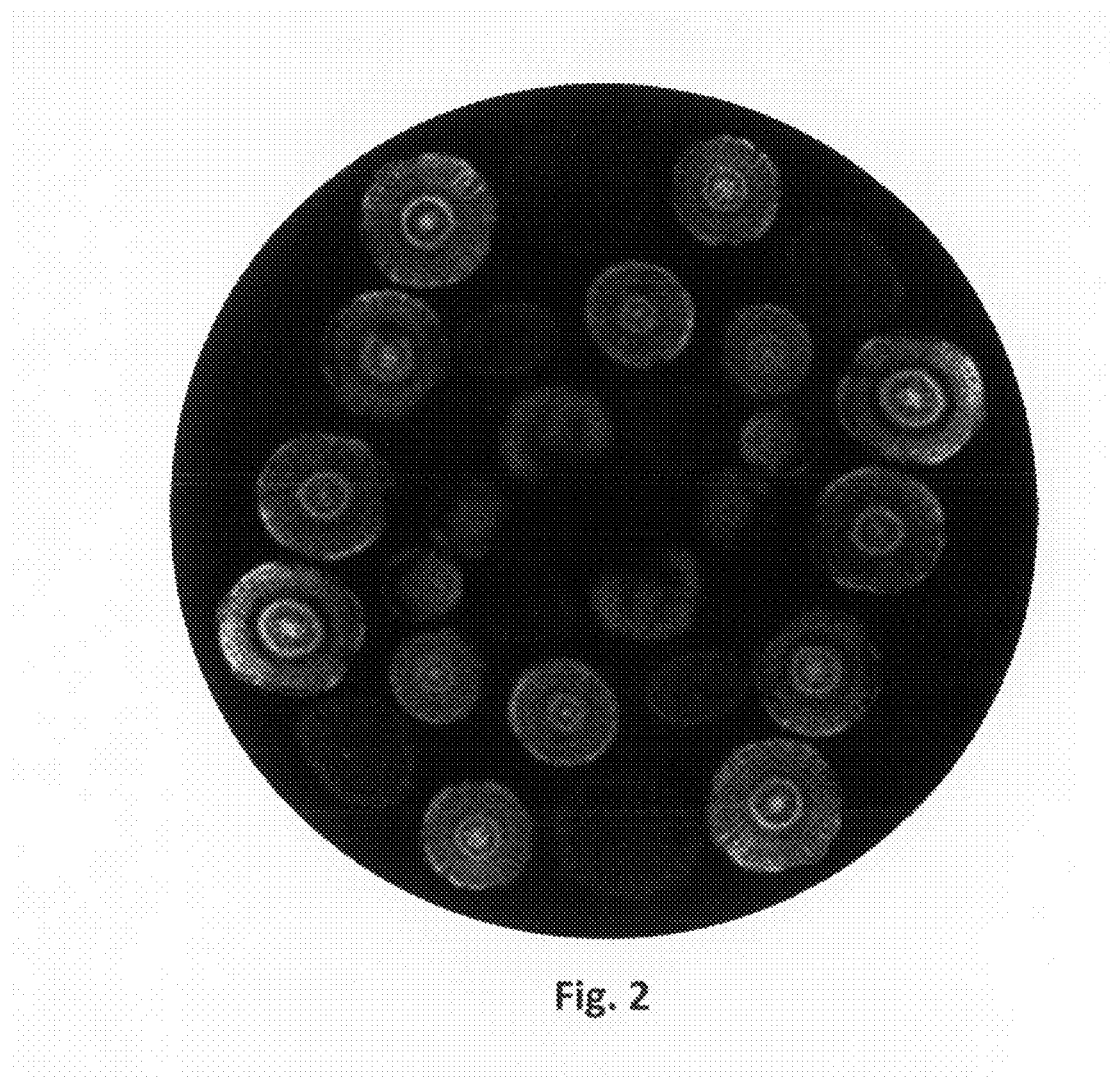
FIG. 2 an MR measurement of a configuration of organic objects using a quadrupolar gradient system for spatial encoding.

Generally, however, the use of non-linear gradients for spatial encoding causes non-homogeneous resolution in the MR measurements. This makes interpretation of the measurements considerably more difficult and therefore greatly restricts use of the method, especially for medical diagnosis. FIG. 2 shows an MR measurement of an organic object, acquired with a quadrupolar gradient system according to the above description. The region with the flattest gradient profile and therefore the lowest resolution is in the center of the FOV. While the edges of the field of view exhibit especially high resolution because of the gradient profile that greatly increases toward the edge, the resolution toward the center decreases continuously. Because of the few, correspondingly large voxels, the object to be imaged can no longer be represented here and the region appears as a "hole" in the MR measurement.

Figure 1:
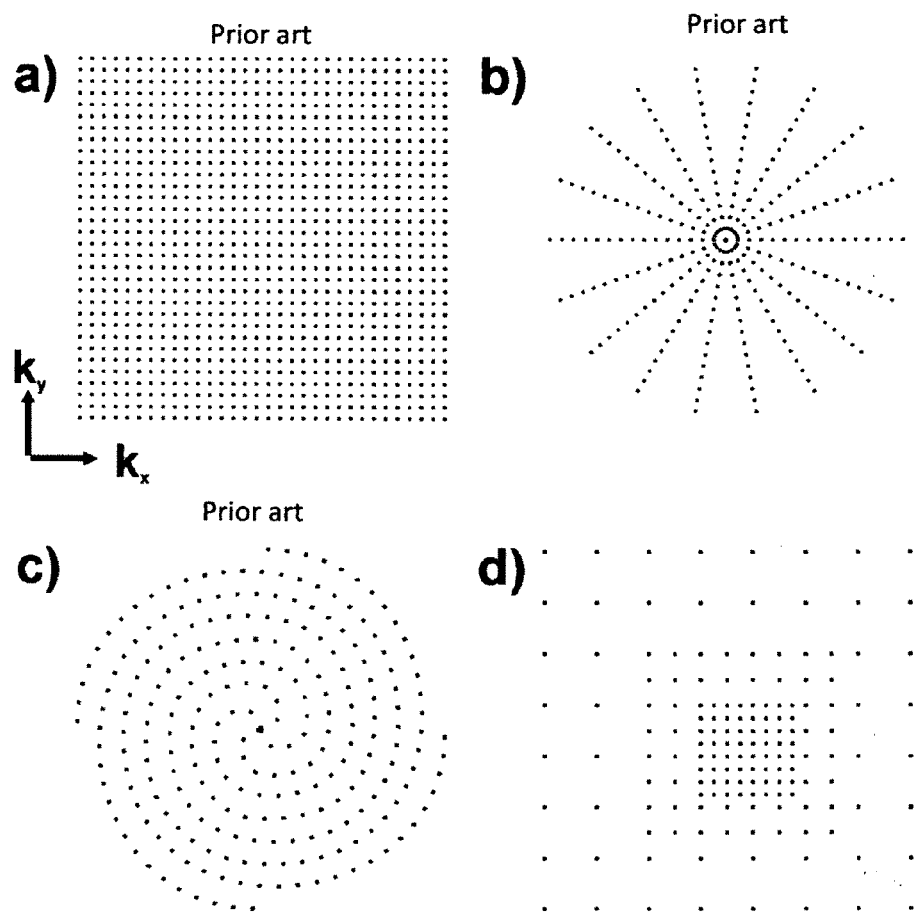
FIG. 1 a) an equidistant, Cartesian k-space sampling pattern.

To date, an increase in the resolution in the lower-resolution regions and therefore step-by-step reduction of the "hole diameter" has only been possible by the standard method of a time-consuming global increase in the resolution in the entire MR measurement by enlarging the matrix size. In the case of standard Cartesian sampling of the k-space, as shown in FIG. 1a, the extent of the largest voxel is given for a quadrupolar gradient field along a dimension by $$\Delta x_{Mitte} = \frac{FOV}{\sqrt{N_x \times 2}} \quad (7)$$

((Mitte = center))

wherein $N_x$ denotes the number of matrix points along the corresponding dimension and FOV denotes the width of the field of view. Even halving the central voxel therefore requires a quadrupling of the matrix size. In the use of non-linear gradient systems, too, the measurement time is determined, as described in equations (5) and (6), by the number of phase encoding steps given by the matrix size and the row measurement duration TR. Reducing the size of the "holes" in the MR measurements therefore results in a large increase in the measurement time. This is especially manifested in the measurement time of three-dimensional head measurements, where, for anatomical reasons, read encoding is performed along the axis of the $B_0$ field and therefore both non-linear gradients have to be used for phase encoding. To be able to halve the extent of the central voxel in both phase encoding directions in such three-dimensional measurements, a 16 fold increase in the matrix size is required.

The method of globally increasing the resolution according to prior art is also characterized in that parts of the additional measurement time are only used to further increase the resolution, contrary to requirements, in those regions that have a steeper gradient profile and therefore already have a sufficiently small voxel size. This not only runs contrary the desired objective of reducing the measurement time but also no additional information can be obtained in regions of high gradient strength in which the physical resolution limit of an MR measurement due to molecular diffusion has been reached. But even in regions with lower resolution, the additional information obtained is already limited because smaller voxels exhibit a lower signal-to-noise ratio(=SNR). Increasing the resolution over and above the requirements therefore worsens the image quality.

Inventive Method

The inventive method is based on the principle that the lower resolution in the MR measurements in the regions with weaker gradients is specifically adapted to the level of resolution in the regions that already have sufficient resolution.

Unlike the standard method, the resolution is not increased globally but only locally. In this way, it is also possible to greatly reduce the size of "holes" in the MR measurements and therefore to also represent structures in the regions of especially weak gradients. Selectively increasing the resolution therefore results in homogenization of the resolution in the entire MR measurement and avoids additionally worsening the image quality in the regions that already have sufficient resolution by avoiding a further reduction in the size of the voxels. It therefore makes the MR measurements correspondingly easier to interpret.

This selective, local increase in resolution is enabled by making use of the existing correlation between the position in k-space and the position in real space. This is a special feature in the use of non-linear gradients for spatial encoding. With the use of linear gradients, which is otherwise common practice, there is no correlation between the encoding and real space position. The consequence of the correlation described is that measurement of lower-frequency k-space signals by sampling the k-space center with high density is already sufficient to represent the object to be imaged with sufficient resolution in the regions with a steeper gradient profile. Here, too, the size of the field of view for a certain gradient field geometry is determined by the spacing of the acquired k-space points ($\Delta k$). The measurement of additional, high-frequency k-space points therefore results in an increase in the image resolution, as described in equation (4). If the spacing of the additional k-space points is increased, these points only contribute to increasing the resolution in a correspondingly smaller field of view, so that the increase in resolution is limited to a certain region. This process is comparable to a reduction of the field of view by increasing the k-space step size. By specifically choosing the position of the additional k-space points and corresponding adjustment of the associated field of view, the associated increase in resolution can be limited to the regions with a weaker gradient profile and therefore poorer resolution.

The method described so far can also be applied to conventional MR measurements using linear gradients for spatial encoding. Also, in the case of use of non-linear gradients for spatial encoding, a reduction in the field of view in the case of non-coverage of the object to be examined can result in aliasing artifacts. However, unlike the case of linear gradients, the image components folded inwardly are already precisely known from the lower-frequency k-spaced data, that is, they already have a resolution in line with the requirements, since there is a correlation between k-space and real space. It is thus possible to describe the aliasing components adequately so that the corresponding artifacts can be eliminated in the regions with increased resolution. The result is a sub-region in the total field of view in which the object to be imaged is represented with a higher resolution but also without artifacts. This is not possible for linear gradients, where there is no correlation between real space and k-space.

Specific inclusion of high-frequency k-space points to increase the resolution locally can in principle be applied to all dimensions in which a non-linear gradient is used for spatial encoding. For example, in the case of application to only one dimension in a two-dimensional measurement, equidistant k-space points are included along the other dimension according to the standard method. The read direction is recommended for this purpose as the standard method because additional measurement of k-space points in this dimension is possible without lengthening the measurement time. In the case of excessive impairment of the SNR in the regions that already have sufficient resolution, it is advisable to group the relevant voxels together.

A preferred k-space sampling pattern suitable for the inventive method is obtained by superposing l Cartesian sub-patterns. Each sub-pattern for each dimension consists of N equidistant k-space points. The dimensionality of the sub-pattern and therefore also of the entire k-space sampling pattern corresponds to the dimensionality of the measurement. Based on the sub-pattern with the smallest point spacing ($n_i=1$, $\Delta k_1 = \Delta k$), the spacing increases for each further sub-pattern according to $$\Delta k_i = \alpha^{(i-1)} \times \Delta k. \tag{8}$$

The k-space point spacing $\Delta k$ of the densest sub-pattern is determined by the size of the associated field of view $FOV_1$. This is usually adapted to the object to be imaged to avoid aliasing artifacts. The number of points N per sub-pattern and dimension determines the resolution within the $FOV_1$ and is thus chosen such that the object to be imaged has a resolution in line with the requirements in the regions with a steep gradient profile. For example, for a quadrupolar gradient field, the following total field of view $FOV_1$ results $$FOV_1 = \sqrt{\frac{2}{\Delta k}}. \tag{9}$$

The k-space points of each further sub-pattern result in a sub-region of the total field of view $FOV_1$ with a size that corresponds to the field of view $FOV_i$ in which the resolution is increased. The size of the individual sub-regions $FOV_i$ for this gradient field is defined by $$FOV_i = \sqrt{\frac{2}{\Delta k_i}} = \sqrt{\frac{2}{\alpha^{(i-1)} \times \Delta k}}. \tag{10}$$

In each additional sub-region, the resolution as compared with the previous sub-region is incremented by the factor $$\frac{1}{\sqrt{\alpha}}.$$

The parameter $\kappa$ $$\kappa(i) = \frac{FOV_i}{FOV_1} = \frac{1}{\sqrt{\alpha^{(i-1)}}} \tag{11}$$

describes the extent to which the resolution is increased in the sub-region $FOV_i$ as compared with the resolution in the total field of view $FOV_1$. The variable spacing factor $\alpha$ must be adapted to the geometry of the object to be imaged and the geometry of the gradient field and determines the step size with which the sub-regions $FOV_i$ are reduced. In the case of odd-numbered spacing factors $\alpha$, for which the points of the sub-patterns would not coincide or only partially coincide in the superposed regions, the corresponding k-space points can be interpolated from the points already sampled because of the higher sampling density of the denser sub-patterns and therefore need not be additionally acquired. FIG. 1d shows the described k-space sampling scheme for two dimensions, where N=8, l=3 and $\alpha$=2.

When the method is applied to one dimension, the ratio of the total number of k-space points to be acquired to that of the standard method of globally increasing the resolution, is, for example, as follows:

$$\frac{\text{\# Punkte Iterationsverfahren}}{\text{\# Punkte Standardverfahren}} = \frac{1 + (l-1) \times 0.5}{2^{l-1}}. \quad (12)$$

((Punkte *Iterationsverfahren* = points iteration method

Punkte *Standardverfahren* = points standard method))

According to equation (12), if l=3 sub-patterns are used, for example, the total number of data points M to be acquired is reduced to 50% of those to be acquired with the standard method of globally increasing the resolution and, if l=4, to even 31% per dimension. This corresponds to a time savings during data acquisition of 50% or 69% respectively.

The inventive method also functions with a k-space sampling pattern that, in turn, represents a superposition of l Cartesian sub-patterns, wherein, however, the number of points per dimension, $N_i$, of the individual sub-patterns i is varied. Based on the sub-pattern with the smallest point spacing (i=1, $\Delta k_1 = \Delta k$), the spacing is doubled for each further sub-pattern according to $$\Delta k_i = 2^{(i-1)} \times \Delta k. \quad (13)$$

The k-space point spacing $\Delta k$ of the densest sub-pattern, in turn, determines the size of the total field of view $FOV_1$. For a quadrupolar gradient field, the size of the sub-regions $FOV_i$ is also defined by equation (10). The enlargement factor κ(i) (equation (14)) now depends on the number of points $N_i$ of each sub-pattern i, so that individual adaptation of the increase in resolution within a sub-region is possible as compared with the neighboring sub-regions.

$$\kappa(i) = \frac{FOV_i \times N_1}{FOV_1 \times N_i} = \frac{N_1}{N_i \times \sqrt{\alpha^{(i-1)}}} \quad (14)$$

According to the inventive method, a k-space sampling pattern is also possible that represents a superposition of l Cartesian sub-patterns, wherein, for example, both the number of points per dimension of the individual sub-patterns i ($N_i$) and the point spacing of the individual sub-patterns ($\Delta k_i$) are varied using a flexible spacing factor $\alpha_i$. Here again, the size of the total field of view is determined by the point spacing of the sub-pattern with the smallest point spacing (i=1), which therefore exhibits the highest sampling density. For a particular gradient field geometry, the size of the largest voxel results from the quantity and spacing of the sampling points of the sub-pattern with the largest point spacing (i=l), which corresponds to the lowest available sampling density $\rho_k$. By simultaneously varying the number of points per dimension of the individual sub-patterns ($N_i$) and flexibly modifying the point spacing between the sub-patterns using the spacing factor $\alpha_i$, a high degree of flexibility is obtained so that more specific k-space sampling patterns can also be approximated from Cartesian sub-patterns with an especially smooth and monotonic change in the sampling density $\rho_k$ with increasing distance from the center of k-space. In this way, it is possible to adapt both the size of the sub-regions and the amount of increase in resolution in these sub-regions to the existing geometry of the gradient field and the object to be imaged.

Figure 3:
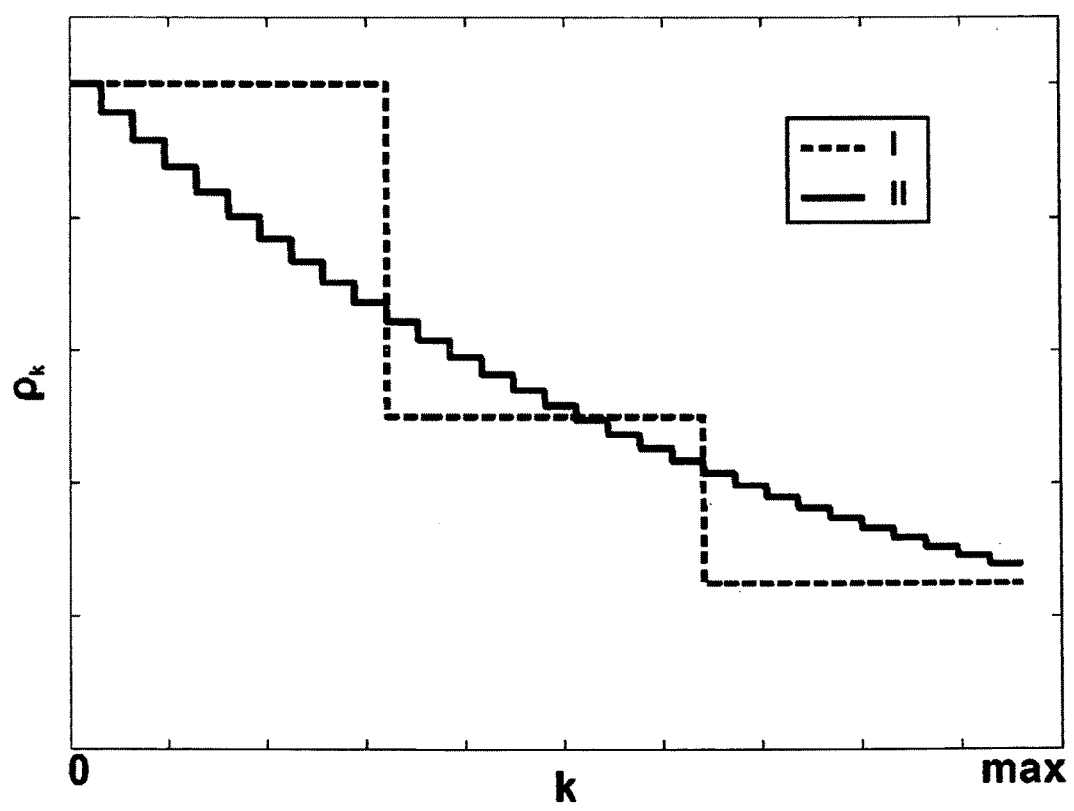
FIG. 3 two different curves of the sampling density ρk as a function of the k-space position k.

By way of example, FIG. 3 shows a sampling density that decreases as the k-space position increases (sampling density I), resulting from the superposition of l=3 sub-patterns with doubled point spacing in each case (α=2, according to equation (8)) and a change in the number $N_i$ of points per sub-pattern i according to $$N_i = \frac{i \times N_1}{\alpha^{(i-1)}} \quad (15)$$

The stepped decline in the sampling density results in reconstructed MR measurement in three sub-regions in which the resolution is increased in steps. On the other hand, the progression of the sampling density II, which is also shown, is composed of l=30 sub-patterns, wherein the sampling spacing according to equation (8) is increased by α=1.045. The variation in the number of sampling points per sub-pattern is also performed analogously to equation (15). Sampling density II thus covers the same k-space region, but the decline in the progression of the sampling density II is clearly smoother than that of sampling density I.

Figure 4:
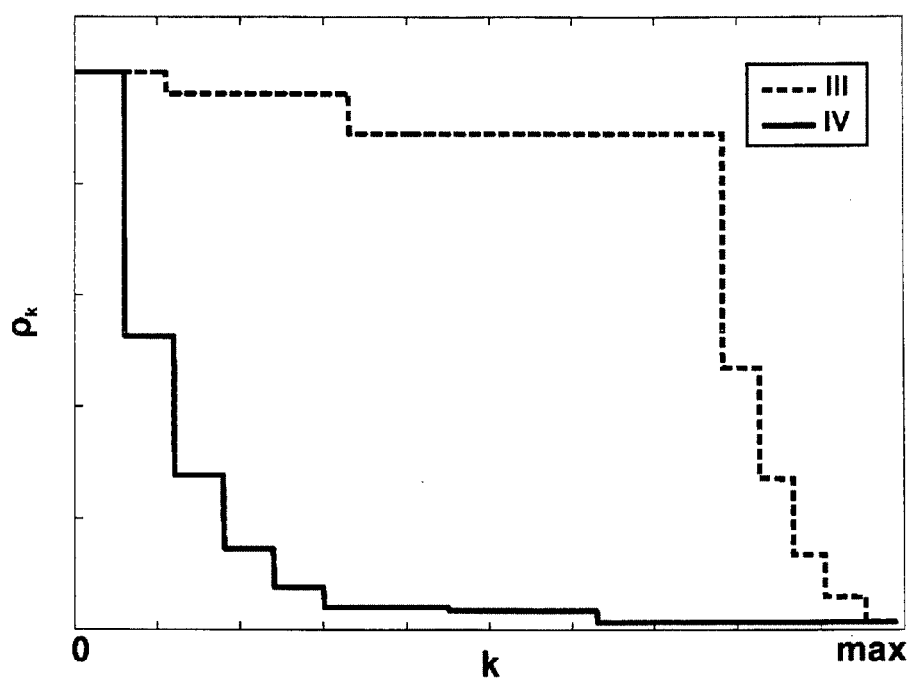
FIG. 4 two further curves of the sampling density ρk as a function of the k-space position k.

The desired exponential decline in this example can therefore be much better approximated. The reconstructed MR measurement therefore has the same total field of view but is composed of 30 sub-regions, so that the smoothest possible increase in resolution can be achieved. FIG. 4 shows by way of example the progression of two sampling densities for a quadrupolar gradient field that were produced by varying parameters $\alpha_i$ and $N_i$. Here, the progression of the sampling density III is SNR-optimized so that large regions of k-space are sampled with high density. The progression of the sampling density IV, on the other hand, is optimized for measurement speed: only the center of k-space is sampled with high density and fewer points are acquired in the remaining regions. The total field of view of the images reconstructed from the k-space data acquired in accordance with the progression of the two sampling densities is of equal size because both sampling densities have the same initial values. Likewise, the largest voxels in each case are of equal size because both sampling densities have the same final values.

Figure 5:
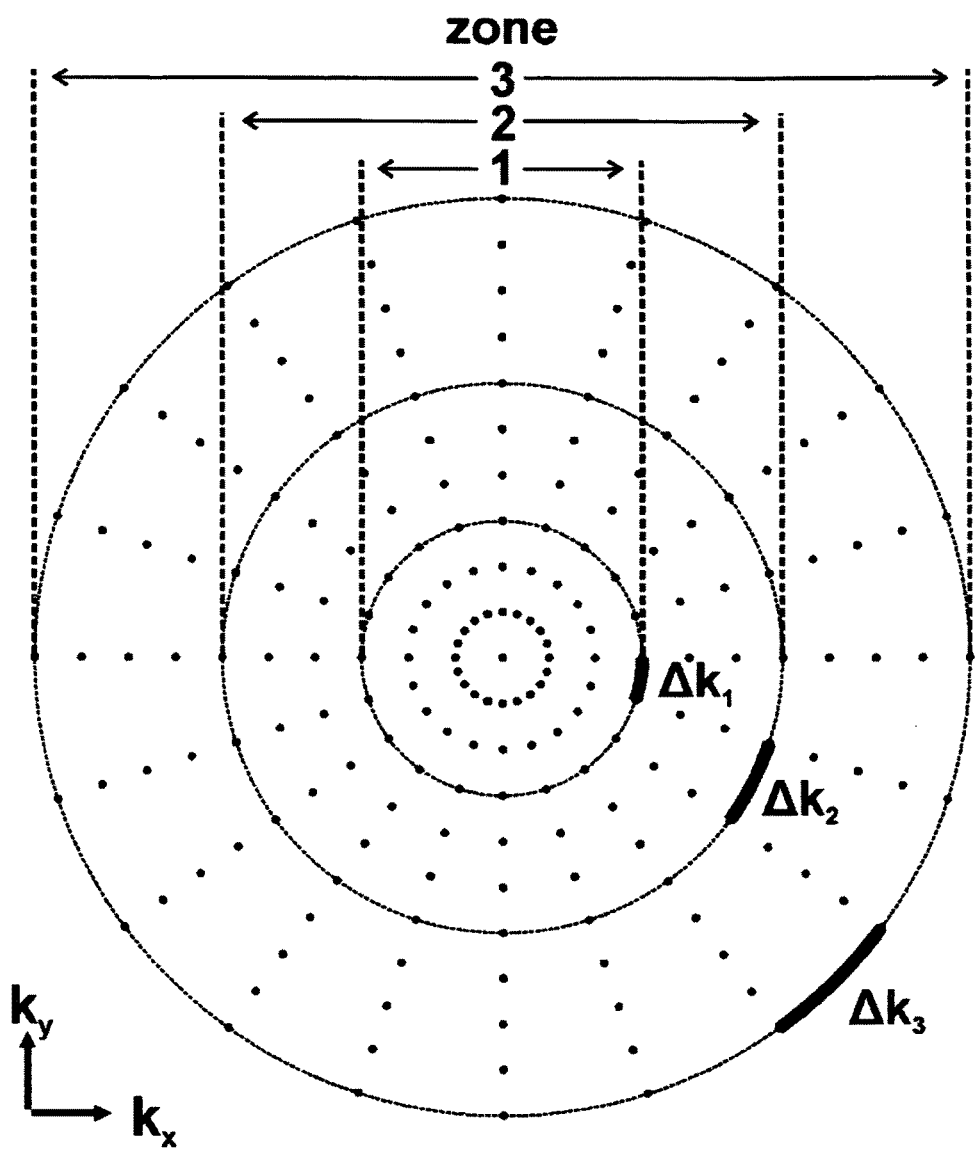
FIG. 5 a radial sampling pattern comprising 20 radii and its distribution into three zones.

FIG. 1b shows a radial k-space sampling pattern [6] comprising 18 radii. The radii, which lie opposite to one another, are preferably acquired by applying the read gradient within a TR. Each gradient is oriented by an appropriate combination of multiple gradient fields. A radial k-space pattern is characterized by a sample density that naturally declines, especially smoothly and monotonically, with the distance from the k-space center, which can be scaled globally by means of the quantity of sampled k-space radii. It can be treated as an independent sampling pattern with variable density, whose subsampling is performed automatically in both dimensions of k-space. However, as FIG. 5 shows, a radial sampling pattern can be divided into l superposed zones. The sampled points within the zones can now be interpolated onto a periodic grid and therefore yield l Cartesian sub-patterns. Based on the increasing sampling density toward the zone center, interpolation of the k-space data is possible without any special loss of information. The step size of each sub-pattern is determined by the maximum point spacing $\Delta k_i$ of each zone. On the other hand, the size of the largest voxel is determined by the maximum point spacing of the outermost zone.

Figure 6:
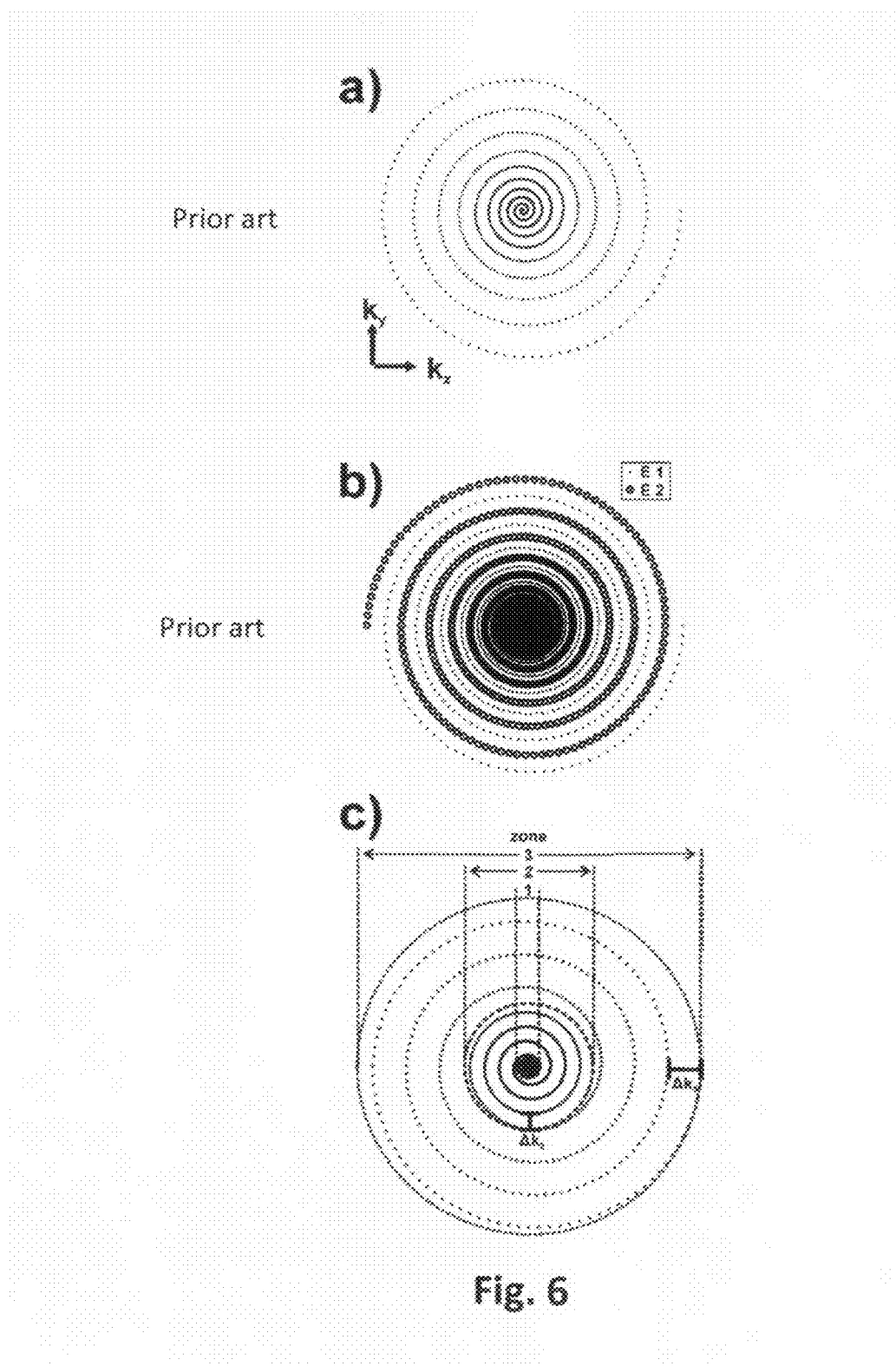

A further preferred k-space sampling pattern is spiral sampling [6] of k-space, wherein the spiral k-space sampling pattern is composed of one or more spiral elements. The sampling density is determined globally by the number of spiral elements and locally by varying the spiral radius pitches. Unlike radial sampling, with this high flexibility, it is also possible to specifically vary the sampling density in the center of k-space as well as the decrease in the k-space sampling density. The read gradient is typically applied along the spiral. For example, in the case of a sufficiently slow signal decay, k-space can be completely sampled by means of a few or merely one single excitation. FIG. 6a shows a spiral k-space sampling pattern with an exponentially increasing spiral radius pitch. The sampling density decreases accordingly with increasing distance from the center of k-space and subsampling is performed automatically in both dimensions of k-space. Adding a second spiral rotated through 180° (see FIG. 6b) doubles the sampling density globally. As with radial sampling, the spiral sampling pattern can also be treated as superposed zones. FIG. 6c shows such a spiral sampling pattern, consisting of three zones. The sampled points within the zones are, in turn, interpolated onto a periodic grid and thus yield l=3 Cartesian sub-patterns. The associated step size results from the maximum point spacing in each zone.

The image intensity in real space is preferably reconstructed from the acquired k-space data by calculation of the inverse mapping matrix $E^{-1}$, which is then applied to the signal intensity S in k-space according to $$I_r = E^{-1} S. \quad (16)$$

Provided enough computer power is available, the MR measurements can thus be calculated directly from the k-space data, eliminating the need for equidistant grids. Further interpolation of the k-space points is therefore not necessary to preclude corresponding distortion of the k-space data. The method therefore also permits use of tailor-made k-space sampling patterns in which the necessary k-space points are acquired specifically and efficiently. The resulting resolution of the MR measurement may be strongly influenced by the type of reconstruction process. Alternatively, direct reconstruction from the k-space data can also be performed by the known method of conjugate gradients [7]. In this case, the product $E^{-1} S$ of the mapping matrix E and the acquired signal intensity is iteratively approximated in k-space. Above all, with larger data sets, this method is preferred to the method of matrix inversion because it requires significantly less computer power and computation time.

Figure 7:
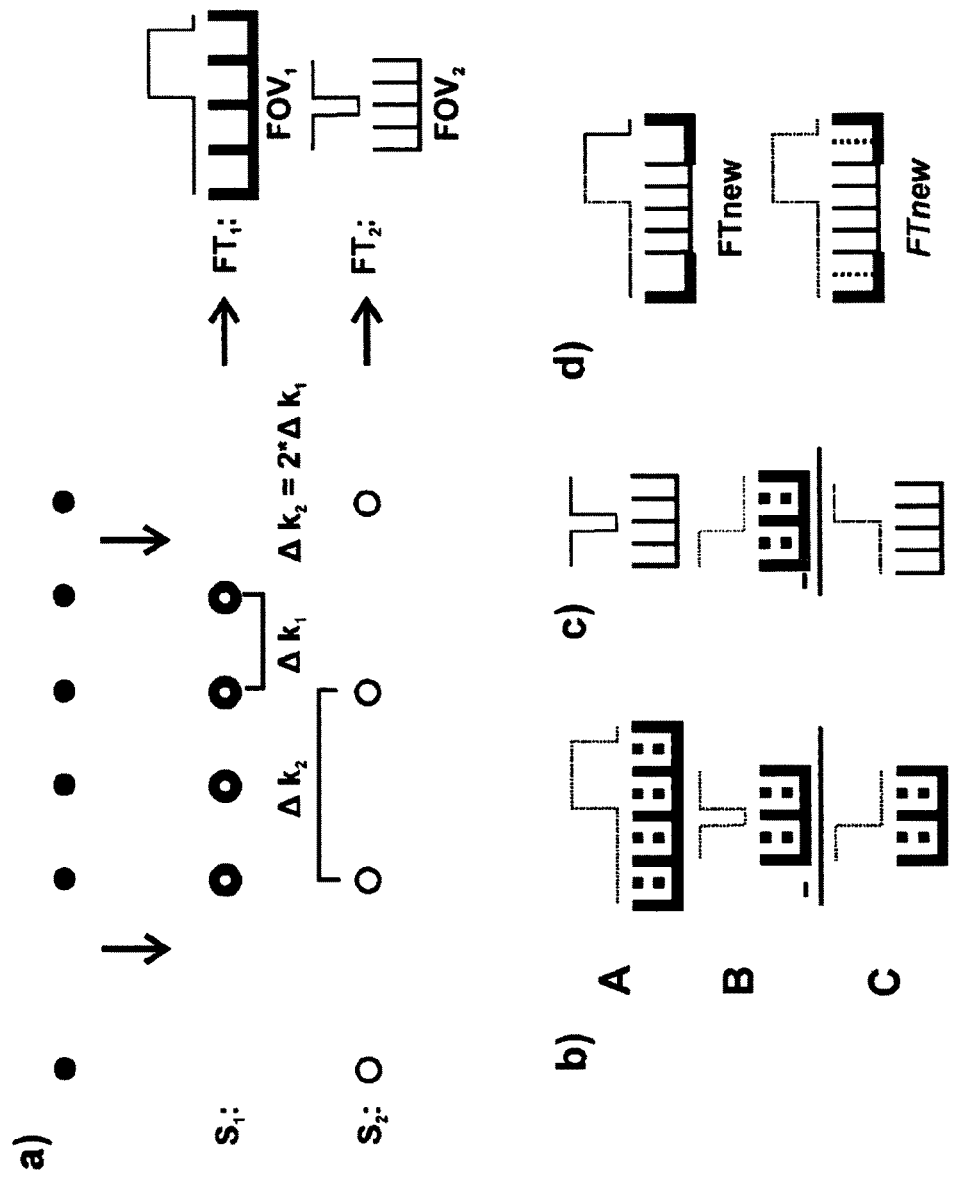
FIG. 7a a one-dimensional k-space sampling pattern and the extraction of two sub-patterns ($S_1$ & $S_2$) and, schematically, the reconstruction of the signal density ($FT_1$ & $FT_2$) from the k-space signals in accordance with the sub-patterns $S_1$ and $S_2$.
FIG. 7b the interpolated signal density $FT_1$ (A), the interpolated and subsequently aliased signal density $FT_1$ (B) and the extracted isolated aliasing (C)
FIG. 7c the elimination of the aliasing from the signal density $FT_2$ by subtraction.
FIG. 7d the resulting signal density $FT_{new}$ from $FT_1$ and corrected $FT_2$, and the modified version $FT_{new}$ in the case of further iteration steps.

Taking the k-space sampling patterns back to equidistant sub-patterns also permits use of standardized, fast Fourier methods as part of the inventive method. The reconstruction scheme designated the iteration method is shown by way of example in FIG. 7 for one dimension and one iteration step. The acquired k-space data permit the extraction of l=2 sub-patterns ($S_1$, $S_2$) that were each composed of N=4 equidistant k-space points. The $FOV_1$ of the signal density $FT_1$ reconstructed by Fourier transform from the k-space data of the sub-pattern $S_1$ covers the entire object to be imaged. Within the smallest $FOV_2$ ($FT_2$), the object has twice the resolution and the relative size of the corresponding voxels in frequency space is represented by the boxes in the drawing. (see FIG. 7a) Now, to be able to replace the inner part of the reconstructed signal density $FT_1$ with the higher-resolution $FT_2$, the latter must be corrected for the components aliased from outside the $FOV_2$. For this purpose, the lower-resolution signal density $FT_1$ is interpolated onto the resolution of the signal density $FT_2$. A copy of the interpolated signal density $FT_1$ is additionally aliased to simulate the signal density $FT_2$. As FIG. 7b shows, it is now possible to describe the aliasing component in isolation by subtracting the two interpolated signal densities. The information thereby obtained permits elimination of the aliasing from the higher-resolution signal density $FT_2$ (see FIG. 7c). The signal density $FT_2$, which is therefore no longer aliased, is now the inner part of the new signal density $FT_{1new}$ (see FIG. 7d). Optionally, the aliasing can also be described using the corresponding ratio between the two interpolated signal densities. If the k-space data of more than two sub-patterns are used, the iterative process starts with reconstruction of the smallest FOV ($FT_{n-1}$ and $FT_n$) because multiply folded aliasing has to be unfolded in reverse. The version $FT_{new}$ also depicted is deployed with consistently equal voxel size by using the interpolated lateral parts in order to enable an iterative process. Because of the lower information content of the lateral voxels in frequency space, this does not have a significant influence on the image quality. After completion of the iterative reconstruction process, transformation from frequency space to image space is performed just once.

Figure 8:
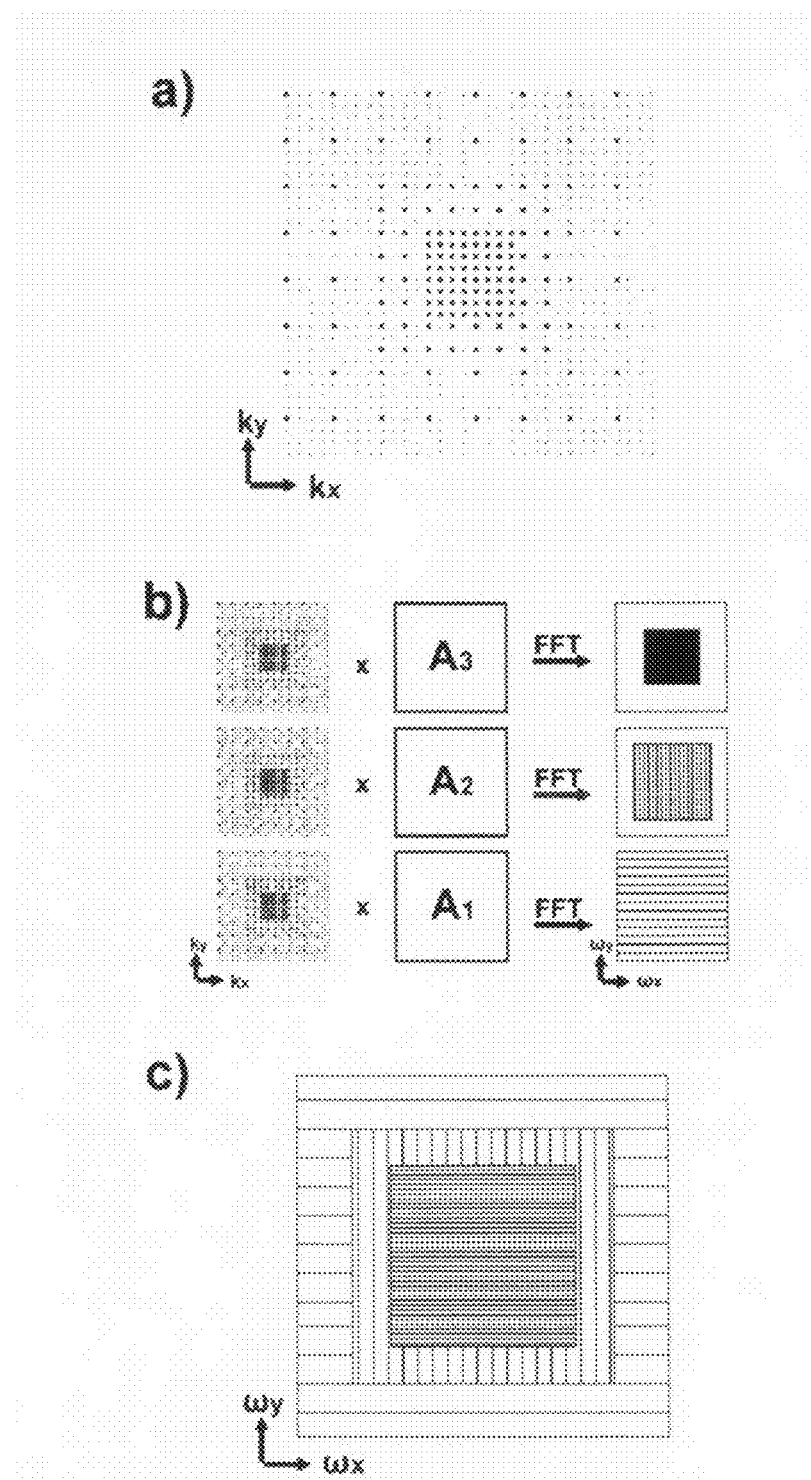
FIG. 8a the distribution of acquired k-space data on an equidistant grid as part of the weighting method.
FIG. 8b the $FOV_i$-specific weighting of the now equidistant k-space and the result after subsequent standard Fourier reconstruction(=FFT), wherein the relevant part of the FOV, which is reconstructed without artifacts, is shown hatched and corresponds to the row spacing of the global resolution (the thinner the row spacing, the higher the global resolution)
FIG. 8c the composite final FOV composed of parts of the individual $FOV_i$.

The weighting method provides an alternative inventive method. In this case, the resolution-homogenized MR measurement is also calculated from the acquired k-space data in frequency space. The associated reconstruction method is illustrated in FIG. 8 for a two-dimensional MR measurement and a k-space sampling pattern consisting of l=3 sub-patterns. The acquired k-space data are first distributed on an equidistant grid, wherein the unsampled positions are filled with zeroes. (see FIG. 8a) A $FOV_i$ with a size according to equation (10) can be assigned to the k-space data of each sub-pattern i. To obtain a signal density without aliasing in this region, a copy of the now equidistant k-space is weighted according to the weighting matrix $A_i$, wherein the relevant weighting matrix $A_i$ results from the mathematical description of the processes performed as part of the iteration method, additionally including the k-space points filled with zeroes. This is followed by reconstruction by means of Fourier transform, using all k-space points. The signal density is automatically calculated for a region equal to the total $FOV_1$, but only the region inside the FOV; can be represented without artifacts. The corresponding region is hatched in FIG. 8b. This process is repeated for each $FOV_i$, wherein the suitable weighting matrix $A_i$ must be used. The number of $FOV_i$ corresponds to the number of sub-patterns l. After completion of the individual reconstructions, the MR measurement, now with homogenized resolution, is put together from the individual $FOV_i$ as shown in FIG. 8c. This is followed by transformation from frequency space to real space.

In a further implementation of the inventive method, elimination of aliasing is supported by additional positional information from the coil sensitivity maps in the iteration method, but also in the weighting method. In the weighting method, the GRAPPA reconstruction technique is used. Non-acquired k-space points within the Cartesian sampled sub-pattern are interpolated from the acquired points by means of calibration factors. The required calibration factors are calculated from the sensitivity distributions of the coils. In the iteration method, the SENSE reconstruction technique can be used instead of the GRAPPA reconstruction technique. The additional aliasing resulting from the non-acquired k-space points within the sub-patterns are eliminated in the reconstructed signal intensities $FT_i$ using the additional spatial information from the different receiver coils. By additional inclusion of the SENSE, or the GRAPPA reconstruction technique, in the iteration method or weighting method, points can be specifically omitted from the sub-patterns. This shortens the measurement time. Moreover, this further embodiment also permits variation of the sampling spacing of the individual sub-patterns with spacing factors larger than $\alpha_i = 2$. Spacing factors larger than $\alpha_i=2$ generally result in a multiple increase in aliasing between the signal intensities ($FT_i$) of successive sub-patterns. The aliasing of the images, which is thus additional aliasing compared with the simple increase in aliasing described in the case of the iteration method, can be folded back using the sensitivity distributions of the receiver coils, as in the SENSE method. For the weighting method, the limitation of the spacing factors to values less than or equal to $\alpha_i=2$ is also eliminated by this further embodiment. However, the GRAPPA reconstruction technique is applied to this. Inclusion of the SENSE, or the GRAPPA method, therefore also permits a reduction in the number l of sub-patterns in the reconstruction method and therefore a further shortening of the measurement time because it means that even fewer k-space points have to be acquired.

Figure 9:
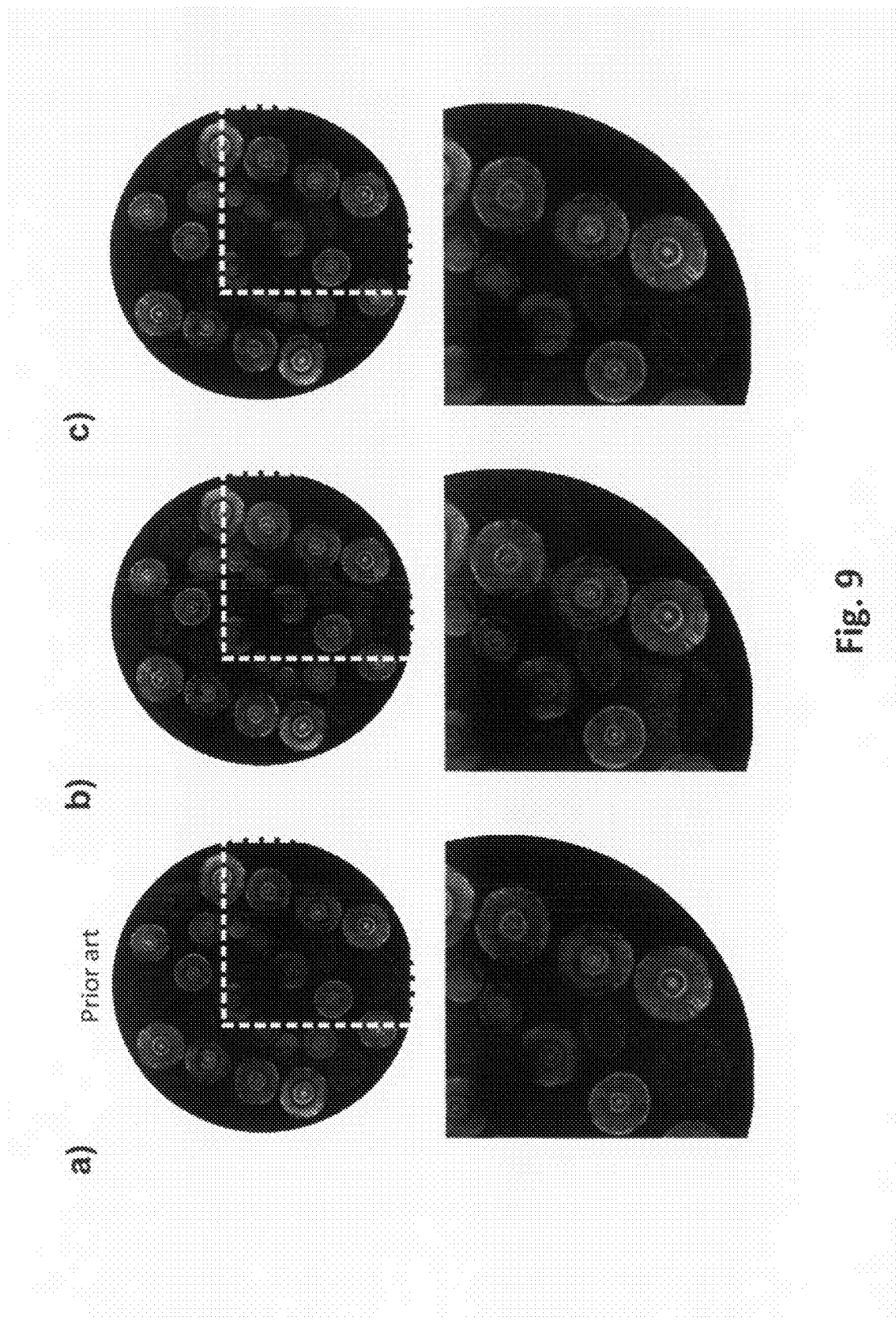
FIG. 9a the resulting MR measurement after application of the standard method of globally increasing the resolution with strongly non-homogenous resolution.
FIG. 9b the MR measurement with homogenized resolution after application of the iteration method.
FIG. 9c the MR measurement with homogenized resolution after application of the weighting method.

FIG. 9 shows one respective embodiment for the described iteration and weighting methods as well as the standard method of globally increasing the resolution. MR data acquisition of an organic object was performed on a Siemens 3T Tim Trio System, equipped with a quadrupolar gradient system. (Sequence: gradient echo, matrix: 512×512, field of view 200 mm×200 mm: slice thickness: 5 mm, TR/TE: 500/16 ms, FA: 50°, BW: 100 Hz). In an analogous way to the sampling scheme shown in FIG. 1d, k-space data with l=3 sub-patterns and N=128 sampling points per dimension and sub-pattern were extracted from the demonstration data set. FIG. 9a shows the reconstruction using all points of the demonstration data set, which corresponds to the standard method of globally increasing the resolution. The spatially very non-homogenous resolution can clearly be seen. Toward the edge regions of the FOV, the increased noise is clearly visible. The result after application of the iteration method is shown in FIG. 9b. Even in regions with previously lower resolution, the object to be imaged can be very well represented. The resolution is clearly more homogenous and the noise in the edge regions is clearly less than in the result of the standard method. Even after multiple iteration steps, the image regions that now have higher resolution are still of high quality. The result after application of the weighting method is shown in FIG. 9c. The resolution is similarly well homogenized and the imaging has especially homogenous SNR distribution. The transitions between the individual $FOV_i$s are therefore barely visible.

REFERENCES

[1] J. L. Duerk, "Principles of MR image formation and reconstruction," Magn Reson Imaging Clin N Am, vol. 7, pp. 629-659, November 1999.
[2] D. J. Larkman and R. G. Nunes, "Parallel magnetic resonance imaging," Phys Med Biol, vol. 52, pp. R15-R55, April 2007.
[3] K. P. Pruessmann, M. Weiger, M. B. Scheidegger, and P. Boesiger, "SENSE: sensitivity encoding for fast MRI," Magn Reson Med, vol. 42, pp. 952-962, November 1999.
[4] M. A. Griswold, P. M. Jakob, R. M. Heidemann, M. Nittka, V. Jellus, J. Wang, B. Kiefer, and A. Haase, "Generalized autocalibrating partially parallel acquisitions (GRAPPA)," Magn Reson Med, vol. 47, pp. 1202-1210, June 2002.
[5] J. Hennig, A. M. Welz, G. Schultz, J. Korvink, Z. Liu, O. Speck, and M. Zaitsev, "Parallel imaging in non-bijective, curvilinear magnetic field gradients: a concept study," MAGMA, vol. 21, pp. 5-14, March 2008.
[6] M. A. Bernstein, K. F. King, and X. J. Zhou, Handbook of MRI Pulse Sequences: Elsevier, 2004.
[7] T. Grotz, B. Zahneisen, A. Ella, M. Zaitsev, and J. Hennig, "Fast functional brain imaging using constrained reconstruction based on regularization using arbitrary projections," Magn Reson Med, vol. 62, pp. 394-405, August 2009.

The invention claimed is:

1. A method of magnetic resonance (=MR) imaging for acquiring images of an object through sampling, on grids in time, a magnetic resonance signal radiated from the object, thereby obtaining sampling points, the method comprising the steps of:
 a) applying non-linear gradient fields for spatial encoding;
 b) completely imaging the object in regions of stronger gradient fields by increasing a density of the sampling points in a center of k-space such that a resulting measurement resolution is sufficient in those reactions of stronger gradient fields;
 c) specifically acquiring additional sampling points in outer regions of k-space according to a k-space sampling pattern and in dependence on a desired distribution of measurement resolution in real space; and
 d) calculating an MR measurement result using the additional sampling points, wherein the MR measurement result has a desired distribution of measurement resolution that deviates from a distribution of measurement resolution given by the non-linear gradient fields.

2. The method of claim 1, wherein a k-space sampling pattern is composed of sub-patterns, each sub-pattern comprising a same number of sampling points and, for each sub-pattern, a distance between the sampling points is increased according to requirements for homogeneity of the resolution of the MR measurement and a signal-to-noise ratio (=SNR) distribution in the measurement.

3. The method of claim 1, wherein a k-space sampling pattern is composed of sub-patterns, wherein, for each sub-pattern, a distance between the sampling points is doubled and a number of sampling points per sub-pattern is varied in accordance with requirements for homogeneity of the resolution of the MR measurement and a signal-to-noise ratio (=SNR) distribution in the measurement.

4. The method of claim 3, wherein a k-space sampling pattern is composed of sub-patterns and, for each sub-pattern, a distance between the sampling points is changed in accordance with requirements for homogeneity of resolution of the MR measurement and for a SNR distribution in the measurement, wherein a number of sampling points per sub-pattern is varied according to requirements for the homogeneity of the resolution of the MR measurement and of the SNR distribution in the measurement and for a particular gradient field geometry, the distance between sampling points of the sub-pattern with a smallest point spacing determining a size of a total field of view, and, for a particular gradient field geometry, the distance between sampling points and number of the sampling points of the sub-pattern with the largest point spacing determining a size of a largest voxel.

5. The method of claim 1, wherein a k-space sampling pattern corresponds to radial sampling of k-space, a sampling density decreasing smoothly and monotonically with a distance from the k-space center, wherein an absolute sampling density is scaled globally by means of a number of k-space radii sampled and, for a particular gradient field geometry, a size of a largest voxel is determined by a length of the k-space radii and by a maximum spacing of the k-space radii at an edge of sampled k-space.

6. The method of claim 1, wherein a k-space sampling pattern corresponds to spiral sampling of k-space, wherein a spiral comprises one or more elements, an absolute sampling density being varied globally by means of a number of spiral elements and locally by varying a spiral radius pitch, wherein, for a particular gradient field geometry, a maximum radial point spacing in a region of center of k-space determines a size of a total field of view, wherein, for a particular gradient field geometry, a maximum distance of the sampling points from the center of k-space and a maximum radial point spacing in an edge region of sampled k-space determine a size of a largest voxel.

7. The method of claim 2, wherein data acquisition is performed with an array comprising multiple receiver coils, wherein spatial information that is contained in a differing sensitivity distribution of the receiver coils is used to increase subsampling of k-space.

8. The method of claim 1, wherein reconstruction of a signal density of the object to be represented is performed by inversion of an encoding matrix from acquired data.

9. The method of claim 1, wherein a signal density of the object to be represented is approximated iteratively by a method of conjugate gradients via a product between an inverse encoding matrix and a signal intensity in k-space.

10. The method of claim 2, wherein k-space points are separately reconstructed according to relevant sub-patterns with fast, standardized Fourier methods and the MR measurement with homogenized resolution is iteratively calculated from individual images of the sub-patterns.

11. The method of claim 7, wherein k-space points are separately reconstructed according to relevant sub-patterns with fast, standardized Fourier methods and the MR measurement with homogenized resolution is iteratively calculated from individual images of the sub-patterns.

12. The method of claim 2, wherein the MR measurement with homogenized resolution is composed of sub-images, the sub-images being reconstructed from all acquired data points using standardized Fourier methods, the data points thereby being distributed over an equidistant grid and weighted with weighting factors specific to each sub-pattern.

13. The method of claim 11, wherein the MR measurement with homogenized resolution is composed of sub-images, the sub-images being reconstructed from all acquired data points using standardized Fourier methods, the data points thereby being distributed over an equidistant grid and weighted with weighting factors specific to each sub-pattern.

14. The method of claim 13, wherein the MR measurement with homogenized resolution is calculated from subsampled k-space signals of different receiver coils using different sensitivity distributions of the receiver coils, wherein only every R-th k-space point of a k-space sampling pattern is acquired, and R≤a number of receiver coils, a subsampling being used to reduce measurement time and/or globally increase resolution.

* * * * *